(12) United States Patent
Tsai et al.

(10) Patent No.: US 11,013,111 B2
(45) Date of Patent: May 18, 2021

(54) ELECTRONIC DEVICE

(71) Applicant: InnoLux Corporation, Miao-Li County (TW)

(72) Inventors: Wen-Chang Tsai, Miao-Li County (TW); Li-Wei Mao, Miao-Li County (TW); Ming-Chun Tseng, Miao-Li County (TW); Chi-Liang Chang, Miao-Li County (TW); Yi-Hua Hsu, Miao-Li County (TW); Meng-Chieh Cheng, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/402,289

(22) Filed: May 3, 2019

(65) Prior Publication Data

US 2019/0373723 A1     Dec. 5, 2019

Related U.S. Application Data

(60) Provisional application No. 62/680,665, filed on Jun. 5, 2018.

(30) Foreign Application Priority Data

Feb. 1, 2019   (CN) .......................... 201910104660.7

(51) Int. Cl.
*H05K 1/02*     (2006.01)
*H05K 1/11*     (2006.01)
(Continued)

(52) U.S. Cl.
CPC .......... *H05K 1/0298* (2013.01); *H01L 33/38* (2013.01); *H05K 1/0274* (2013.01); *H05K 1/11* (2013.01); *H05K 1/181* (2013.01)

(58) Field of Classification Search
CPC .... H05K 1/0298; H05K 1/0274; H01L 33/38; H01L 33/62; H01L 25/0753
See application file for complete search history.

(56) References Cited

U.S. PATENT DOCUMENTS 8,785,220 B2 * 7/2014 Schwab .................. H01L 51/56
                                                              438/26
2001/0032985 A1   10/2001 Bhat et al.
(Continued)

FOREIGN PATENT DOCUMENTS

EP            2 830 090 A1      1/2015

OTHER PUBLICATIONS

European Search Report dated Oct. 21, 2019, issued in application No. EP 19176094.1.

*Primary Examiner* — Ishwarbhai B Patel
(74) *Attorney, Agent, or Firm* — McClure, Qualey & Rodack, LLP (57) ABSTRACT

An electronic device includes a first substrate, a first conductive layer, a plurality of first electrode pads, a plurality of first light-emitting units, a plurality of first signal pads and a conductive structure. The first conductive layer is disposed on the first substrate. The first electrode pads are disposed on the first conductive layer. The first light-emitting units overlap and are disposed on the first electrode pads. The first light-emitting units are electrically connected to the first electrode pads respectively. The first signal pads are disposed on the first conductive layer and electrically connected to the first conductive layer. The conductive structure is disposed on the first signal pads, and at least two of the first signal pads are electrically connected to each other through the conductive structure.

20 Claims, 10 Drawing Sheets

(51) Int. Cl.
*H05K 1/18* (2006.01)
*H01L 33/38* (2010.01)

(56) References Cited

U.S. PATENT DOCUMENTS

| | | | |
|---|---|---|---|
| 2004/0223328 A1* | 11/2004 | Lee | F21S 4/22 |
| | | | 362/249.01 |
| 2007/0094630 A1 | 4/2007 | Bhooshan | |
| 2012/0155076 A1* | 6/2012 | Li | F21V 9/30 |
| | | | 362/231 |
| 2014/0159064 A1* | 6/2014 | Sakariya | H01L 25/0753 |
| | | | 257/88 |
| 2014/0362565 A1* | 12/2014 | Yao | H01L 25/0753 |
| | | | 362/223 |
| 2015/0028376 A1* | 1/2015 | Corwin | H01L 25/0753 |
| | | | 257/99 |
| 2015/0069523 A1 | 3/2015 | Or-Bach et al. | |
| 2018/0033853 A1 | 2/2018 | Bower et al. | |

* cited by examiner

ELECTRONIC DEVICE

CROSS REFERENCE TO RELATED APPLICATIONS

This application claims the benefit of U.S. Provisional Application No. 62/680,665, filed Jun. 5, 2018, and also claims the benefit of Chinese Patent Application No. 201910104660.7, filed Feb. 1, 2019, the entirety of which is incorporated by reference herein.

BACKGROUND

Technical Field

Embodiments of the present disclosure relate to an electronic device, and in particular they relate to an electronic device including a conductive structure.

Description of the Related Art

As technology advances, some electronic devices are designed to have a larger size, high resolution, thin or narrow frame, etc., and the tiled electronic devices are designed to have such characteristics. There are still many aspects of current electronic devices that need improvement. Therefore, how to satisfy the above characteristics has become a subject.

SUMMARY

Generally, the thickness of the conductive layer disposed on an array substrate is thinner, and the impedance of the conductive layer may be higher, which may cause uneven signal transmission. This issue may be reduced by increasing the number of circuit boards, thereby increasing the cost, or it is need to have more space on the array substrate, and it is difficult to meet the demand for a narrow frame. Therefore, the present disclosure suggests some embodiments that may deal with the above issues.

In accordance with some embodiments of the present disclosure, an electronic device includes a first substrate, a first conductive layer, a plurality of first electrode pads, a plurality of first light-emitting units, a plurality of first signal pads and a conductive structure. The first conductive layer is disposed on the first substrate. The first electrode pads are disposed on the first conductive layer. The first light-emitting units overlap and are disposed on the first electrode pads. The first light-emitting units are electrically connected to the first electrode pads respectively. The first signal pads are disposed on the first conductive layer and electrically connected to the first conductive layer. The conductive structure is disposed on the first signal pads, and at least two of the first signal pads are electrically connected to each other through the conductive structure.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is disposed on (or formed on) a second feature in the description that follows may include embodiments in which the first feature and second feature are disposed (or formed) in direct contact, and may also include embodiments in which additional features may be disposed (or formed) between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 45 degrees or at other orientations) and the spatially relative descriptors used herein may likewise be interpreted accordingly.

In the present disclosure, the terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about" and "substantially", the stated value includes the meaning of "about" or "substantially".

It should be understood that, although the terms "first," "second," "third," etc. can be used herein to describe various elements, components, regions, layers and/or sections, these elements, components, regions, layers and/or sections should not be limited through these terms. These terms are only used to distinguish one element, component, region, layer or section from another region, layer or section. Thus, a first element, component, region, layer or section discussed below could be termed a second element, component, region, layer or section without departing from the teachings of the present disclosure.

Unless otherwise defined, all terms (including technical and scientific terms) used herein have the same meaning as commonly understood through one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

Further, the elements in the drawings are merely illustrative, and the dimensions (including length, width, or height) of the elements should not be limited in the drawings. Furthermore, the electronic device described in the present disclosure may include a display device, a light-emitting device, a detecting device, a touch device, or other suitable device, but the disclosed embodiments are not limited thereto.

Figure 1:
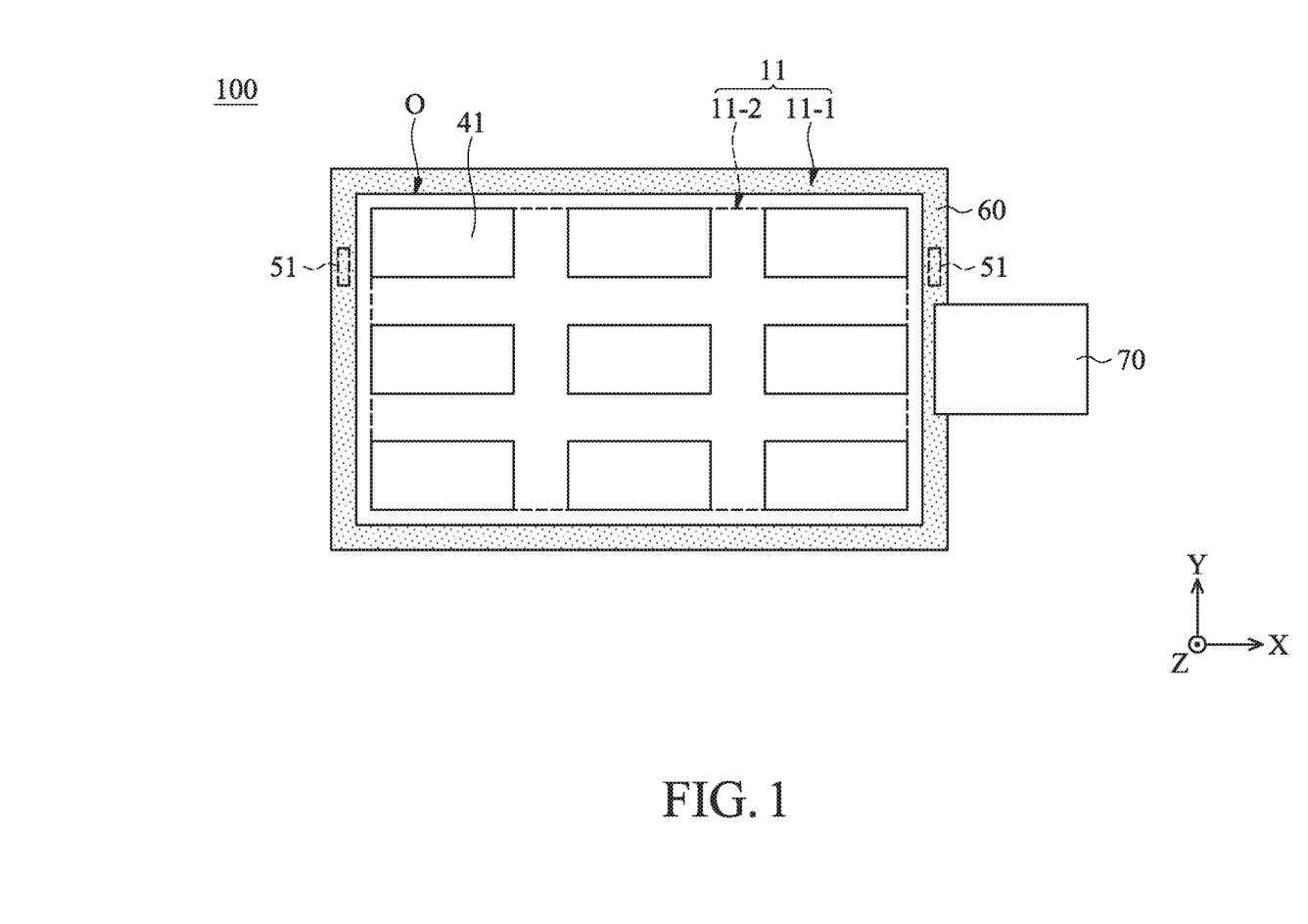
FIG. 1 is a partial top view illustrating an electronic device according to one embodiment of the present disclosure.
Figure 2:
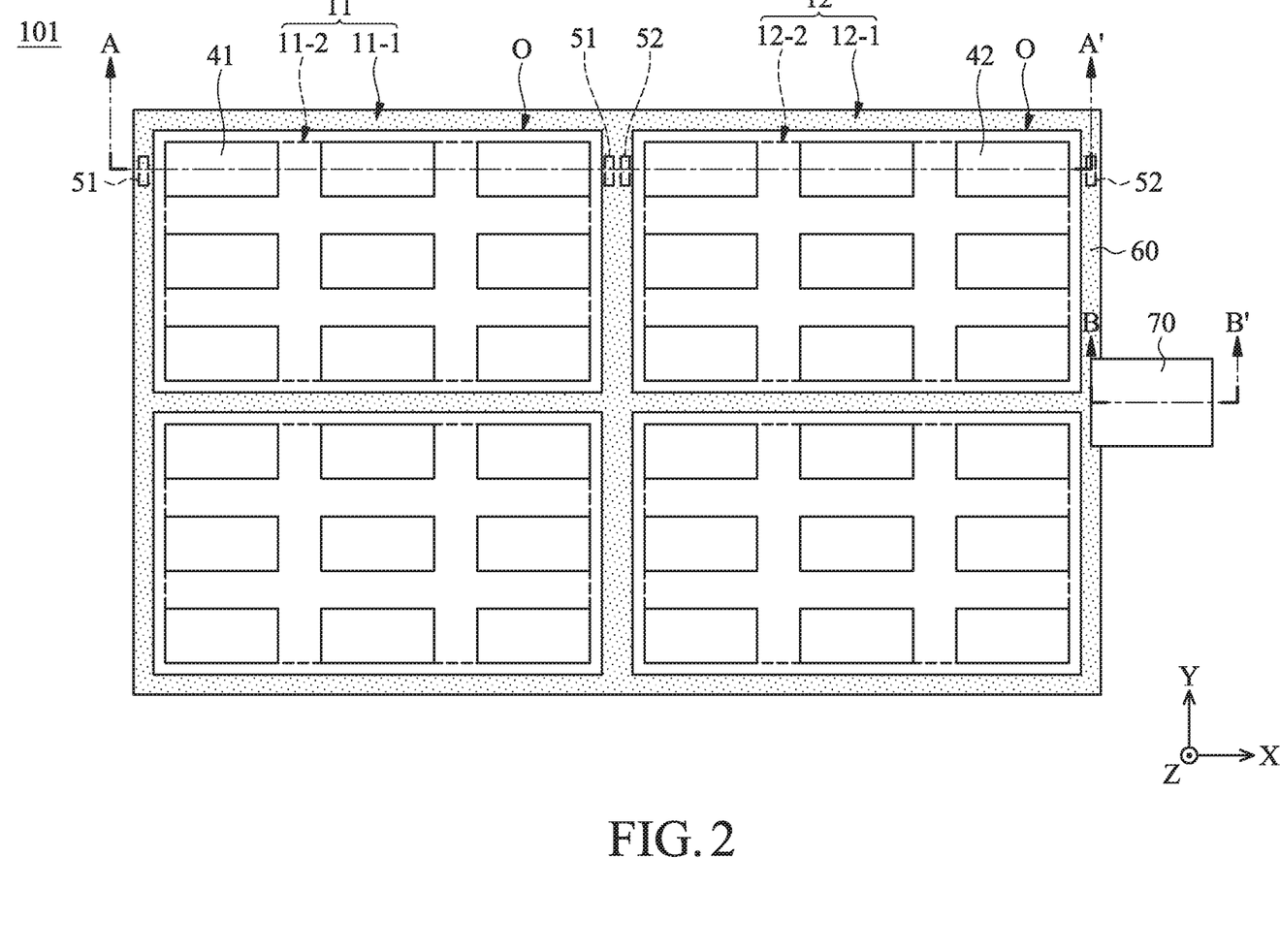
FIG. 2 is a partial top view illustrating a tiled electronic device according to one embodiment of the present disclosure.
Figure 3:
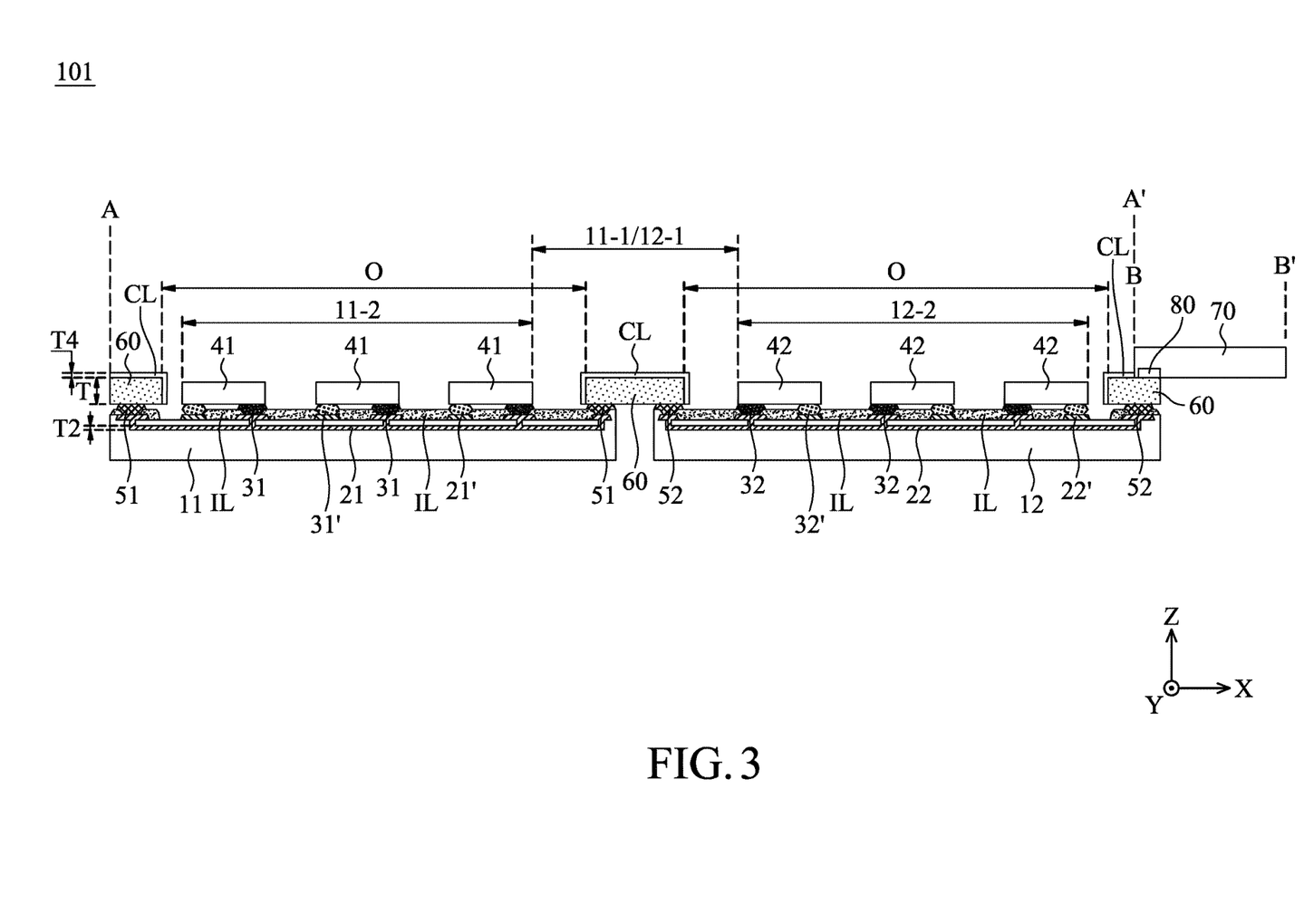
FIG. 3 is a partial cross-sectional view illustrating the tiled electronic device 101 along line A-A' and line B-B' in FIG. 2.

FIG. 1 is a partial top view illustrating an electronic device 100 according to one embodiment of the present disclosure. FIG. 2 is a partial top view illustrating a tiled electronic device 101 according to one embodiment of the present disclosure. FIG. 3 is a partial cross-sectional view illustrating the tiled electronic device 101 along line A-A' and line B-B' in FIG. 2. In the embodiment as shown in FIG. 1, the electronic device 100 may include a substrate, and in the embodiment as shown in FIG. 2, the tiled electronic device 101 may include a plurality of substrates. It should be noted that, the corresponding positions or the materials of the elements (or layers) on the substrate of the electronic device 100 may be the same as or be similar to the corresponding elements (or layers) disposed on the plurality of substrates of the tiled electronic device 101. The elements (or layers) mentioned above may include conductive layers, electrode pads, light-emitting units, signal pads or other suitable elements (or layers), which may refer to the following embodiments (as shown in FIG. 1 to FIG. 3) in more detail. Therefore, the cross-sectional view of the electronic device 100 may also refer to the cross-sectional view as shown in FIG. 3.

Referring to FIG. 1 and FIG. 3, the electronic device 100 includes a first substrate 11, a first conductive layer 21 and 21', a plurality of first electrode pads 31 and 31', a plurality of first light-emitting units 41, a plurality of first signal pads 51 and a conductive structure 60. The first conductive layer 21 may be electrically connected to the plurality of first electrode pads 31 and the plurality of first signal pads 51, respectively. For example, the first substrate 11 may be an array substrate, and the first conductive layer 21 may be disposed (or formed) on the first substrate 11. In some embodiments, the first conductive layer 21 may be used as the conductive line for transmitting voltage signals. The material of the first conductive layer 21 may include metals (e.g., copper, molybdenum, aluminum, tungsten, gold, chromium, nickel, platinum, titanium), alloys (e.g., alloys of the above metals), transparent conductive materials, other suitable conductive materials, or a combination thereof, but it is not limited thereto. The transparent conductive materials may include indium tin oxide (ITO), tin oxide (TO), indium zinc oxide (IZO), indium gallium zinc oxide (IGZO), antimony-doped tin oxide (ATO), aluminium-doped zinc oxide (AZO), but it is not limited thereto. The first conductive layer 21 may include a single-layer material, a multi-layer material or a composite material. In some embodiments, the first electrode pads 31 are disposed on the first conductive layer 21, the first light-emitting units 41 overlap and are disposed on the first electrode pads 31, and the first light-emitting units 41 are electrically connected to the first electrode pads 31, respectively. In more detail, the cathode (and/or anode) of the first light-emitting unit 41 may be electrically connected to the first conductive layer 21 through the first electrode pads 31. That is, the first electrode pads 31 may be used as the pads of the first light-emitting units 41. In some embodiments, the first light-emitting units 41 may include light-emitting diodes (LED), micro LED, mini LED, quantum dot light-emitting diodes (QLED/QDLED), quantum dots or other suitable components, but it is not limited thereto. In some embodiments, the first light-emitting units 41 may include organic light-emitting diodes (OLED), but it is not limited thereto.

In some embodiments, the first signal pads 51 are disposed on the first conductive layer 21 and electrically connected to the first conductive layer 21, the conductive structure 60 is disposed on the first signal pads 51, and at least two of the first signal pads 51 are electrically connected to each other through the conductive structure 60 as shown in FIG. 3. For example, the first signal pads 51 are disposed between the conductive structure 60 and the first conductive layer 21 in the Z-direction (i.e., the normal direction of the first substrate 11), and the conductive structure 60 is electrically connected to the first conductive layer 21 through the first signal pads 51 as shown in FIG. 1 and FIG. 3. In some embodiments, the conductive structure 60 may overlap at least part of the first signal pads 51 in the Z-direction.

In some embodiments, the conductive structure 60 is electrically connected to the circuit board 70 as shown in FIG. 1 or voltage-signal supply circuits (not shown). The circuit board 70 may include a flexible printed circuit (FPC), a chip on film (COF) or a printed circuit board (PCB), but it is not limited thereto. In some embodiments, the circuit board 70 may be electrically connected to the first conductive layer 21 through a conductive pad 80 (see FIG. 3). In more detail, the circuit board 70 is disposed on the first substrate 11, at least one voltage signal transmitted through (or supplied from) the circuit board 70 may be transmitted to the first conductive layer 21 through the conductive structure 60, and the voltage signal may be transmitted to the first light-emitting units 41 through the first conductive layer 21. The first light-emitting units 41 may modulate the light to be emitted or the brightness of the light according to the received voltage signal, but the present disclosure is not limited thereto. The voltage signal mentioned above may include a supply voltage (e.g., VDD, VSS), a bias voltage, a reset voltage, a ground voltage (GND), or another suitable voltage signal, but it is not limited thereto.

In some embodiments, the first signal pads 51 may be used as power pads, but it is not limited thereto. In some embodiments, the material of the first electrode pads 31 may be the same as the material of the signal pads 51, or the material of the first electrode pads 31 may be different from the material of the signal pads 51. In some embodiments, the material of the first electrode pads 31 (or the material of the signal pads 51) may include nickel, copper, gold, tin, silver, other suitable conductive materials, alloys of the above metals or a combination thereof, but it is not limited thereto. It should be noted that the connecting relationship between the first signal pads 51 and the first conductive layer 21 is not limited to that as shown in FIG. 3. Other suitable conductive materials may be disposed between the first signal pads 51 and the first conductive layer 21.

In some embodiments, the voltage signals transmitted through (or supplied from) the circuit board 70 may be transmitted to the light-emitting units (e.g., the first light-emitting units 41) by the conductive structure 60 with low impedance, which can enhance the transmission efficiency of the voltage signal or reduce the number of circuit boards 70. For example, the impedance of the conductive structure 60 may be lowered by increasing the thickness T of the conductive layer 60 as shown in FIG. 3, or by using a low-impedance material (e.g., gold, silver, copper) in the conductive layer 60, but the present disclosure is not limited thereto. In some embodiments, the thickness T of the conductive layer 60 may be greater than or equal to the thickness T2 of the first conductive layer 21 as shown in FIG. 3, but it is not limited thereto. The thickness T of the conductive layer 60 may be defined by a maximum thickness of the conductive layer 60 in the Z-direction, and the thickness T2 of the first conductive layer 21 may be defined by a minimum thickness of the first conductive layer 21 in the Z-direction. The detailed measurement method of the above thicknesses will be described later.

In some embodiments, the first substrate 11 may be divided into a first region 11-1 and a second region 11-2, and the first region 11-1 may be adjacent to (or surround) the second region 11-2 as show in FIG. 1. The first region 11-1 may be a non-operating region (or non-display region), while the second region 11-2 may be an operating region (or display region). In some embodiments, the outermost first light-emitting units may respectively has at least one side edge closest to the edge of the first substrate 11 as shown in FIG. 1. The connected lines (such as the dashed-lines shown in FIG. 1) of these side edges (or the extension lines of the side edges) may form a second region 11-2 of the first substrate 11, and a region other than the second region 11-2 is the first region 11-1 of the first substrate 11. For example, the first light-emitting units 41 may include the light-emitting diodes, micro LED, mini LED or quantum dot light-emitting diodes, the profile of the first light-emitting unit 41 may be defined by the boundary of the first light-emitting unit 41 projecting on the first substrate 11 in the Z-direction, but it is not limited thereto, and the side edges closest to the edge of the first substrate 11 may be obtained from the profile. Or, the profile of the first light-emitting units 41 may be defined by the boundary of the uppermost layers (or elements) included in the first light-emitting units 41 projecting on the first substrate 11 in the Z-direction, but it is not limited thereto, and the side edges closest to the edge of the first substrate 11 may be obtained from such profile. In some embodiments, one of the first light-emitting units 41 may include a cathode electrode, an anode electrode or a light-emitting layer, but it is not limited thereto.

In some embodiments (not shown), the first light-emitting units 41 include organic light-emitting diodes, and the boundary of the first light-emitting units 41 may be defined by a pixel defining layer (PDL), but it is not limited thereto. For example, the pixel defining layer (now shown) may be disposed on the first substrate 11, and the pixel defining layer may have a plurality of openings. The first light-emitting units 41 may respectively be disposed corresponding to or overlap the openings of the pixel defining layer. The projecting area of the openings of the pixel defining layer on the first substrate 11 may be defined as the profile of the first light-emitting units 41, but it is not limited thereto.

As shown in FIG. 1, the first light-emitting units 41 may be disposed corresponding to (or overlap) the second region 11-2 of the first substrate 11. That is, the first light-emitting units 41 may be disposed in the second region 11-2. The conductive structure 60 may be disposed corresponding to (or overlap) the first region 11-1 of the first substrate 11. That is, the conductive structure 60 may be disposed in the first region 11-1, but it is not limited thereto.

In some embodiments, the conductive structure 60 may have at least one openings O, and the openings O may be disposed corresponding to (or overlap) the second region 11-2 as shown in FIG. 1; or the openings O may overlap at least one of the first light-emitting units 41. In some embodiments, at least part of the conductive structure 60 may overlap at least one of the first light-emitting units 41.

Referring to FIG. 2 and FIG. 3, the electronic device 101 may be a tiled electronic device. The electronic device 101 includes a first substrate 11, a first conductive layer 21 and 21', a plurality of first electrode pads 31 and 31', a plurality of first light-emitting units 41, a plurality of first signal pads 51 and a conductive structure 60. Moreover, the electronic device 101 further includes a second substrate 12, a second conductive layer 22 and 22', a plurality of second electrode pads 32 and 32', a plurality of second light-emitting units 42 and a plurality of second signal pads 52. The second substrate 12 may be an array substrate. The second conductive layer 22 may be disposed (or formed) on the second substrate 12, and the second conductive layer 22 may be electrically connected to the plurality of second electrode pads 32 and the plurality of second signal pads 52. The material of the second conductive layer 22, the material of the second electrode pads 32, and/or the material of the second signal pads 52 may be the same as or different from the material of the first conductive layer 21, the material of the first electrode pads 31, and/or the material of the first signal pads 51, respectively.

In some embodiments (FIG. 3), the second electrode pads 32 are disposed on the second conductive layer 22, the second light-emitting units 42 may overlap (or be disposed on) the second electrode pads 32, and the second light-emitting units 42 are electrically connected to the second electrode pads 32 respectively. The second electrode pads 32 may be used as the pads of the second light-emitting units 42, and the second light-emitting units 42 may be electrically connected to the second conductive layer 22 through the second electrode pads 32.

In some embodiments, the second signal pads 52 are disposed on the second conductive layer 22, and the second signal pads 52 are electrically connected to the second conductive layer 22, the conductive structure 60 is disposed on the second signal pads 52, and at least two of the second signal pads 52 are electrically connected to each other through the conductive structure 60 as shown in FIG. 3. For example, the second signal pads 52 are disposed between the conductive structure 60 and the second conductive layer 22 in the Z-direction (i.e., the normal direction of the second substrate 12). In some embodiments, the conductive structure 60 is electrically connected to the second conductive layer 22 through the second signal pads 52 as shown in FIG.

2 and FIG. 3. In some embodiments, the conductive structure 60 may overlap at least part of the second signal pads 52 in the Z-direction.

Moreover, similar to the first substrate 11, the second substrate 12 may be divided into a first region 12-1 and a second region 12-2, and the first region 12-1 may be adjacent to (or surround) the second region 12-2. The first region 12-1 of the second substrate 12 may be a non-operating region (or non-display region), the second region 12-2 of the second substrate 12 may be an operating region (or display region). The definition of the first region 12-1 of the second substrate 12 and the definition of the second region 12-2 of the second substrate 12 may be similar to the definition of the first region 11-1 of the first substrate 11 and the definition of the second region 11-2 of the first substrate 11, which will not be repeated here. As shown in FIG. 2, the second light-emitting units 42 may be disposed corresponding to (or overlap) the second region 12-2 of the second substrate 12. That is, the second light-emitting units 42 may be disposed in the second region 12-2. The conductive structure 60 may be disposed corresponding to (or overlap) the first region 12-1 of the second substrate 12. That is, the conductive structure 60 may be disposed in the first region 12-1, but it is not limited thereto. In some embodiments, the second signal pads 52 may be disposed corresponding to (or overlap) the first region 12-1. That is, the second signal pads 52 may be disposed in the first region 12-1, but it is not limited thereto.

In some embodiments, the conductive structure 60 may have at least one openings O, and the openings O may be disposed corresponding to (or overlap) the second region 11-2 and/or the second region 12-2 as shown in FIG. 2; or the openings O may overlap at least one of the first light-emitting units 41 and/or at least one of the second light-emitting units 42. In some embodiments, at least one portion of the conductive structure 60 may overlap at least one of the second light-emitting units 42.

In some embodiments, the circuit board 70 may be electrically connected to at least one of the first signal pads 51 and at least one of the second signal pads 52 through conductive structure 60. In more detail, at least one voltage signal transmitted through (or supplied from) the circuit board 70 may be transmitted to the first conductive layer 21 and/or the second conductive layer 22 through the conductive structure 60, and the voltage signals may be transmitted to the first light-emitting units 41 through the first conductive layer 21, and the voltage signals may be transmitted to the second light-emitting units 42 through the second conductive layer 22, but it is not limited thereto. The second signal pads 52 may be used to connect the conductive structure 60 to the second conductive layer 22. In some embodiments, the second signal pads 52 may be used as power pads, but it is not limited thereto.

In some embodiments, the connecting relationships between various elements (or layers) or the materials of various elements (or layers) disposed on the second substrate 12 may be the same as or similar to those disposed on the first substrate 11, except for the conductive structure. The elements (or layers) mentioned above may include the conductive layer, the electrode pads, the light-emitting units, the signal pads or other suitable elements (or layers).

It should be noted that, the electronic device 101 having four substrates is used as an example, but the present disclosure is not limited thereto. The electronic device may be a tiled electronic device having more or fewer substrates. The number and arrangement of the substrates (including the first substrate 11 or the second substrate 12), the light-emitting units (including the first light-emitting units 41 or the second light-emitting units 42), the signal pads (including the first signal pads 51 or the second signal pads 52) or other elements as shown in the figures of the present disclosure are examples only, and the present disclosure is not limited thereto. The substrates (including the first substrate 11 or the second substrate 12) as shown in the figures of the present disclosure are illustrated to be rectangular, but those are examples. In some embodiments, the shape of substrates (including the first substrate 11 or the second substrate 12) may include curved, polygonal, obtuse, acute or irregular shapes. Furthermore, the number of the circuit boards 70, the position of the circuit boards 70 or the way for electrically connecting the circuit boards 70 and the conductive structure 60 are not limited to the embodiments as shown in FIG. 1 and FIG. 2. In some embodiments, the circuit boards 70 may be in direct contact with the conductive structure 60, and the circuit boards 70 may be electrically connected to the conductive structure 60; or the circuit boards 70 may be electrically connected to the conductive structure 60 by other conductive elements (e.g., the circuit structure LS), which will be described in following FIG. 6 and FIG. 7.

In some embodiments, the conductive structure 60 may be manufactured by inkjet printing or net technology, and may be disposed on the first signal pads 51 and the second signal pads 52 by compression, welding or laser heating, but the present disclosure is not limited thereto.

In some embodiments, the electronic device 101 (or the electronic device 100) may include a protective layer CL, and the protective layer CL may be disposed on the conductive structure 60 as shown in FIG. 3. In some embodiments, the protective layer CL may cover the conductive structure 60, and not overlap or cover the light-emitting units (such as the first light-emitting units 41 and the second light-emitting units 42), but it is not limited thereto. In some embodiments, the protective layer CL may cover a portion of an insulating layer IL, and the insulating layer IL may be disposed between the first conductive layer 21 and the first light-emitting units 41. In some embodiments, the insulating layer IL may be disposed between the second conductive layer 22 and the second light-emitting units 42, but it is not limited thereto. In some embodiments, the material of the protective layer CL may include an absorption material, a light-shielding material, a material having buffering feature, a material having protective feature or a combination thereof, but it is not limited thereto. In some embodiments, the material of the protective layer CL may be water-proof, anti-static or antifouling. In some embodiments, the protective layer CL may include a single-layer material, a multi-layer material or a composite material. In some embodiments, the thickness T4 of the protective layer CL may be less than or equal to the thickness T of the conductive structure 60. In other embodiments, the thickness T4 of the protective layer CL may be greater than or equal to the thickness T of the conductive structure 60. The thickness T4 of the protective layer CL may be defined by a minimum thickness of the protective layer CL in the Z-direction. In some embodiments, the material of the protective layer CL may include a transparent material, and at least part of the protective layer CL may overlap or not overlap the light-emitting units.

Figure 4:
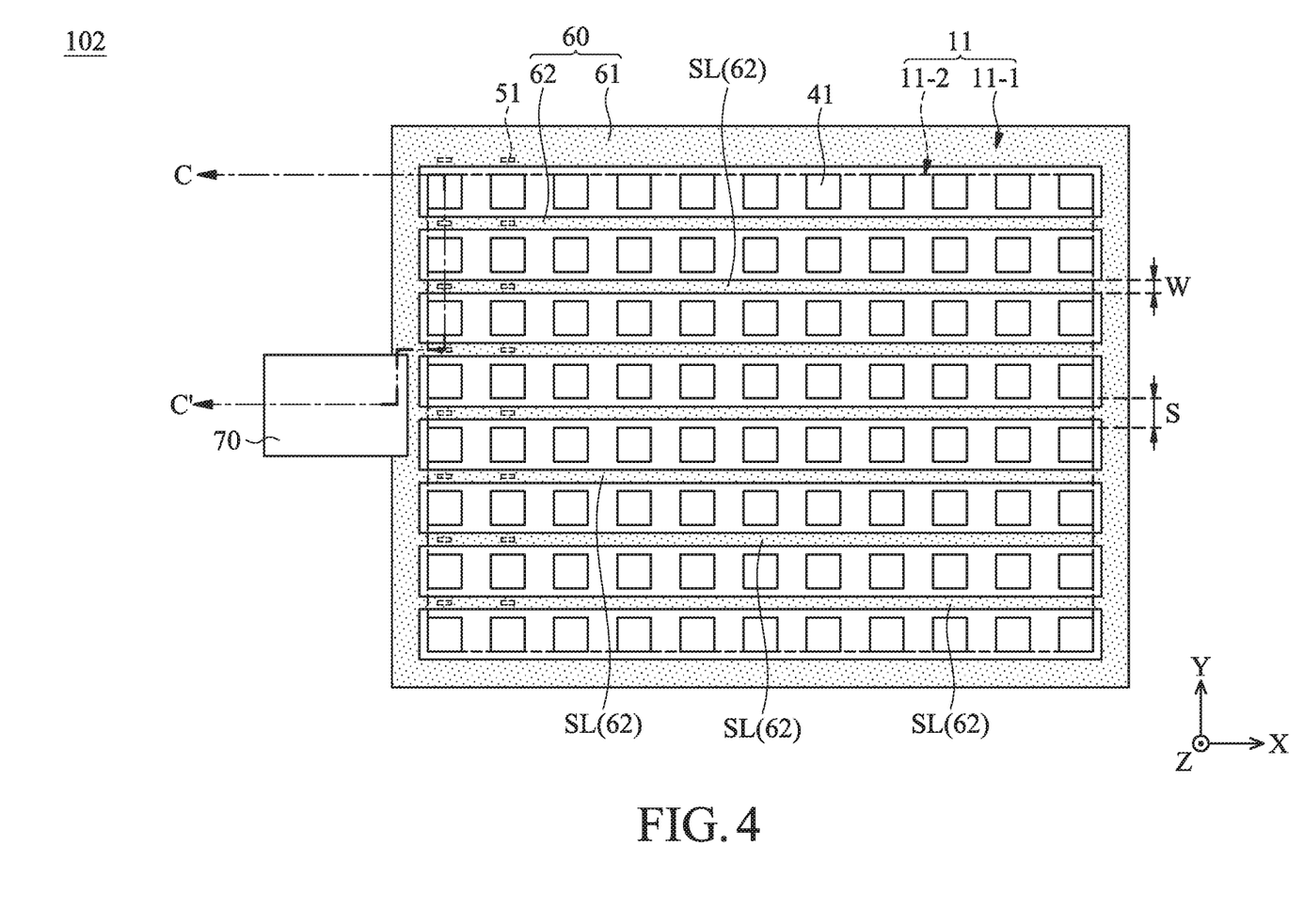
FIG. 4 is a partial top view illustrating an electronic device according to another embodiment of the present disclosure.
Figure 5:
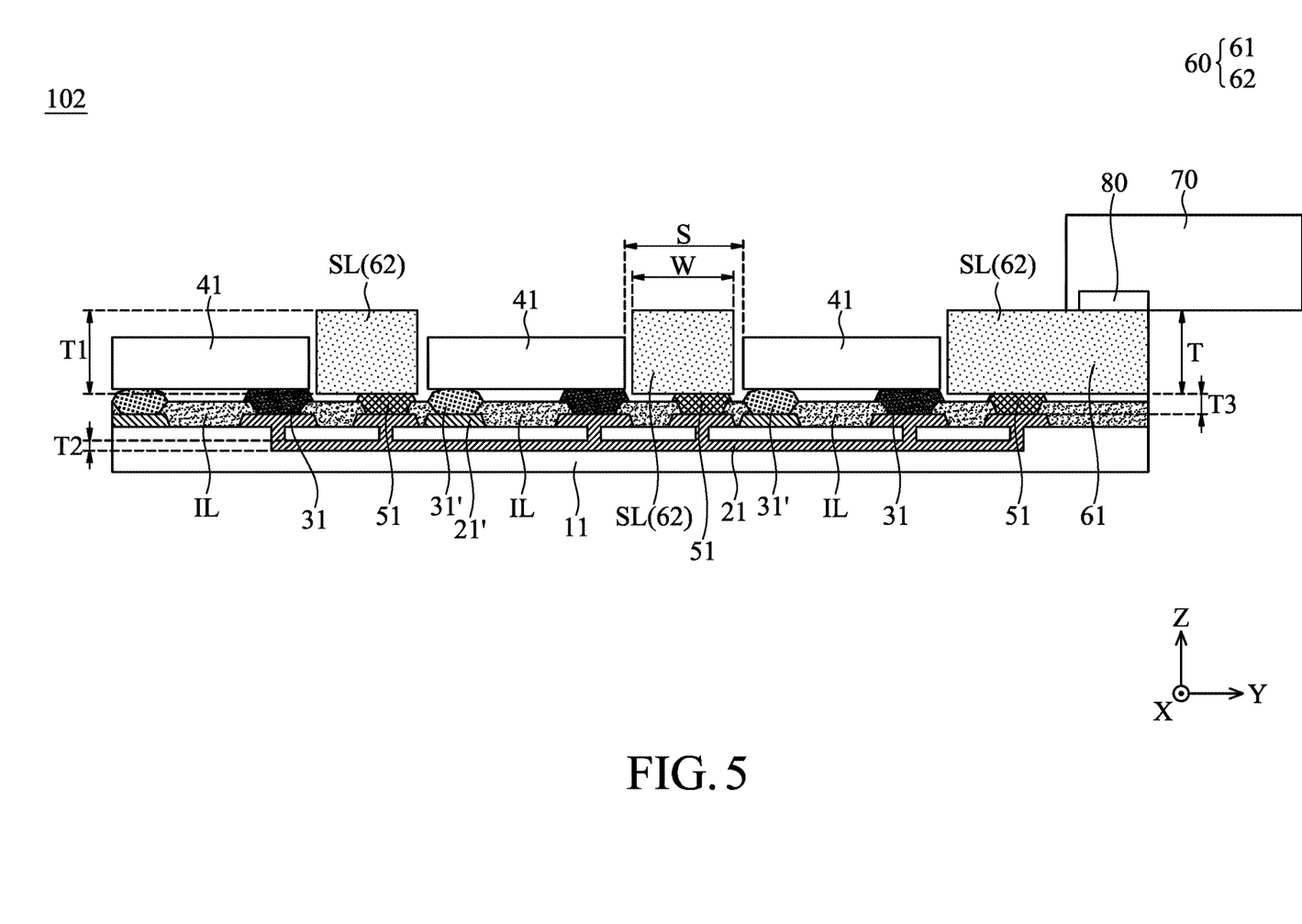
FIG. 5 is a partial cross-sectional view illustrating the electronic device along line C-C' in FIG. 4.

FIG. 4 is a partial top view illustrating an electronic device 102 according to another embodiment of the present disclosure. FIG. 5 is a partial cross-sectional view illustrating the electronic device 102 along line C-C' in FIG. 4. The embodiment as shown in FIG. 4 is similar to the embodiment as shown in FIG. 1. The first substrate 11 may be divided into a first region 11-1 and a second region 11-2, and the plurality of first light-emitting units 41 may be disposed corresponding to the second region 11-2. The differences between the embodiment as shown in FIG. 4 and the embodiment as shown in FIG. 1 is that the conductive structure 60 of the electronic device 102 may be disposed corresponding to (or overlap) the first region 11-1 and the second region 11-2. That is, the conductive structure 60 may be disposed in first region 11-1 and the second region 11-2.

In some embodiments, the conductive structure 60 may be divided into a first portion 61 and a second portion 62 as shown in FIG. 4 and FIG. 5. The first portion 61 may be disposed corresponding to (or overlap) the first region 11-1. That is, the first portion 61 may be disposed in the first region 11-1. The second portion 62 may be disposed corresponding to (or overlap) the second region 11-2. That is, the second portion 62 may be disposed in the second region 11-2.

In some embodiments, the second portion 62 of the conductive structure 60 may include at least one signal line SL. In FIG. 4, the signal lines SL may extend along the X-direction, but it is not limited thereto. In other embodiments (e.g., the embodiment as shown in following FIG. 9), the signal lines SL may extend along the Y-direction or other directions. In some embodiments, the material of the signal line SL may include a material having low impedance, but it is not limited thereto. In some embodiments, the material of the signal line SL may include metals (e.g., gold, silver, copper, etc.), alloys or other suitable materials, but it is not limited thereto. In some embodiments, the material of the signal line SL may include a single-layer material, a multi-layer material or a composite material.

In some embodiments, the thickness T1 of the signal line SL may be greater than or equal to the thickness T2 of the first conductive layer 21 as shown in FIG. 5. In some embodiments, the thickness T of the first portion 61 of the conductive structure 60 may be the same as or different from the thickness T1 of the signal line SL. In some embodiments, the material of the first portion 61 of the conductive structure 60 may be the same as or different from the material of the second portion 62 (e.g., the signal lines SL) of the conductive structure 60. In some embodiments, the material of the first portion 61 of the conductive structure 60 may be the same as the material of the signal line SL, and the thickness T of the first portion 61 of the conductive structure 60 may be substantially the same as the thickness T1 of the signal line SL as shown in FIG. 5, but it is not limited thereto. In some embodiments, the first portion 61 of the conductive structure 60 and the signal lines SL may be manufactured in the same process. In some embodiments, the first portion 61 of the conductive structure 60 may be connected to or contact with the second portion 62 of the conductive structure 60.

In some embodiments, the width W of the signal line SL of the second portion 62 of the conductive structure 60 may be less than or equal to the gap S between two adjacent first light-emitting units 41 as shown in FIG. 5. The width W may be defined by a maximum width of the signal line SL along a direction perpendicular to an extending direction of the signal line SL. For example, the signal lines SL extend along the X-direction as shown in FIG. 4 and FIG. 5, so the width W may be defined by the maximum width of the signal line SL in the Y-direction, wherein Y-direction may be perpendicular to X-direction and Z-direction. The gap S may be defined by a minimum gap between two adjacent ones of first light-emitting units 41 in the direction perpendicular to the extending direction of the signal line SL. For example, the signal lines SL extend along the X-direction as shown in FIG. 4 and FIG. 5, and the gap S may be defined by the minimum gap between two adjacent ones of first light-emitting units 41 in the Y-direction.

In some embodiments, the ratio of the width W of the signal line SL of the second portion 62 of the conductive structure 60 to the gap S between two adjacent first light-emitting units 41 (i.e., W/S) may be between 0.05 and 0.95 ($0.05 \leq W/S \leq 0.95$). In some embodiments, W/S may be between 0.05 and 0.4 ($0.05 \leq W/S \leq 0.4$), or between 0.4 and 0.7 ($0.4 \leq W/S \leq 0.7$), or between 0.7 and 0.95 ($0.7 \leq W/S \leq 0.95$).

It should be noted that, if the width W of the signal line SL of the second portion 62 of the conductive structure 60 may be narrow, the impedance may be higher, and the voltage signals cannot be uniformly transmitted to the light-emitting units. Moreover, if the width W of the signal line SL of the second portion 62 is greater than the gap S, the lights emitted from the first light-emitting units 41 (and/or the second light-emitting units 42) may be shielded, which may influence the brightness of the lights. Therefore, if W/S is in the range mentioned above, which can increase the uniformly of voltage signals transmitted to the light-emitting units, or the influence of the brightness of the lights may be reduced.

It should be noted that the width W and/or the gap S may be measured using optical microscopy (OM), but it is not limited thereto. The OM image may include at least two first light-emitting units 41 and one signal line SL, the maximum width of the signal line SL in the image may be measured to obtain the width W, and the minimum gap between two adjacent ones of the first light-emitting units 41 in the image may be measured to obtain the gap S, but it is not limited thereto. The width W and the gap S may be obtained by observing local cross-sectional view (e.g., the C-C' cross-sectional view in FIG. 5, but it is not limited thereto) using a scanning electron microscope (SEM). In the local cross-sectional view, the maximum width of the signal line SL may be measured to obtain the width W, and the minimum gap between two adjacent ones of the first light-emitting units 41 may be measured to obtain the gap S, but it is not limited thereto.

As shown in FIG. 5, the signal line SL of the second portion 62 of the conductive structure 60 may have a thickness T1, and the first conductive layer 21 may have a thickness T2. In some embodiments, the ratio of thickness T1 to thickness T2 may be between 10 and 300 ($10 \leq T1/T2 \leq 300$), but it is not limited thereto. In some embodiments, the ratio of thickness T1 to thickness T2 may be between 10 and 200 ($10 \leq T1/T2 \leq 200$). In some embodiments, the ratio of thickness T1 to thickness T2 may be between 10 and 100 ($10 \leq T1/T2 \leq 100$). In some embodiments, the thickness T1 may be greater than or equal to the thickness T2. The thickness T1 may be defined by a maximum thickness of the signal line SL in the Z-direction, and the thickness T2 may be defined by a minimum thickness of the first conductive layer 21 in the Z-direction.

In some embodiments, the thickness T2 of the first conductive layer 21 may be between 1 μm and 10 μm ($1 \mu m \leq T2 \leq 10 \mu m$). In some embodiments, the thickness T2 of the first conductive layer 21 may be between 1 μm and 2 μm ($1 \mu m \leq T2 \leq 2 \mu m$), or between 5 μm and 10 μm ($5 \mu m \leq T2 \leq 10 \mu m$). The thickness T1 of the signal line SL may be between 100 μm and 300 μm ($100 \mu m \leq T1 \leq 300 \mu m$). In some embodiments, the thickness T1 of the signal line SL may be between 100 μm and 200 μm ($100 \mu m \leq T1 \leq 200 \mu m$), or between 200 µm and 300 µm (200 µm≤T1≤300 µm). In some embodiments, one of the first signal pads 51 may have a thickness T3 as shown in FIG. 5, and the ratio of thickness T1 of the signal line SL to thickness T3 of one of the first signal pads 51 may be between 0.05 and 100 (0.05≤T1/T3≤100), but it is not limited thereto. In some embodiments, the ratio of thickness T1 to thickness T3 may be between 0.5 and 50 (0.5≤T1/T3≤50). It should be noted that the thickness of the above elements may be obtained by observing a local cross-sectional view (e.g., the C-C' cross-sectional view in FIG. 5, but it is not limited thereto) using a scanning electron microscope, and the thickness of the corresponding elements (or layers) may be measured in a local cross-sectional view, or they may be measured by another suitable measuring method.

Figure 6:
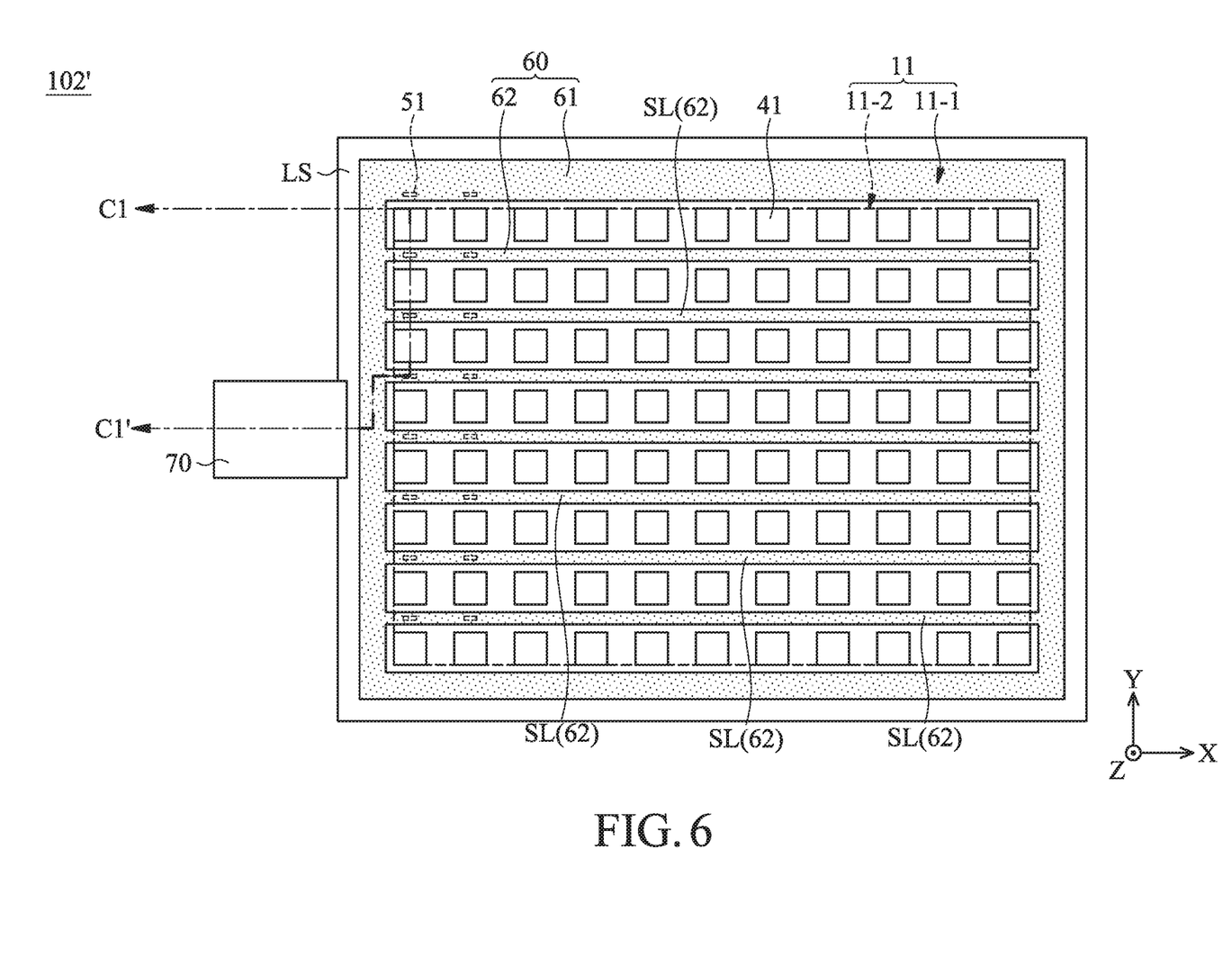
FIG. 6 is a partial top view illustrating an electronic device according to another embodiment of the present disclosure.
Figure 7:
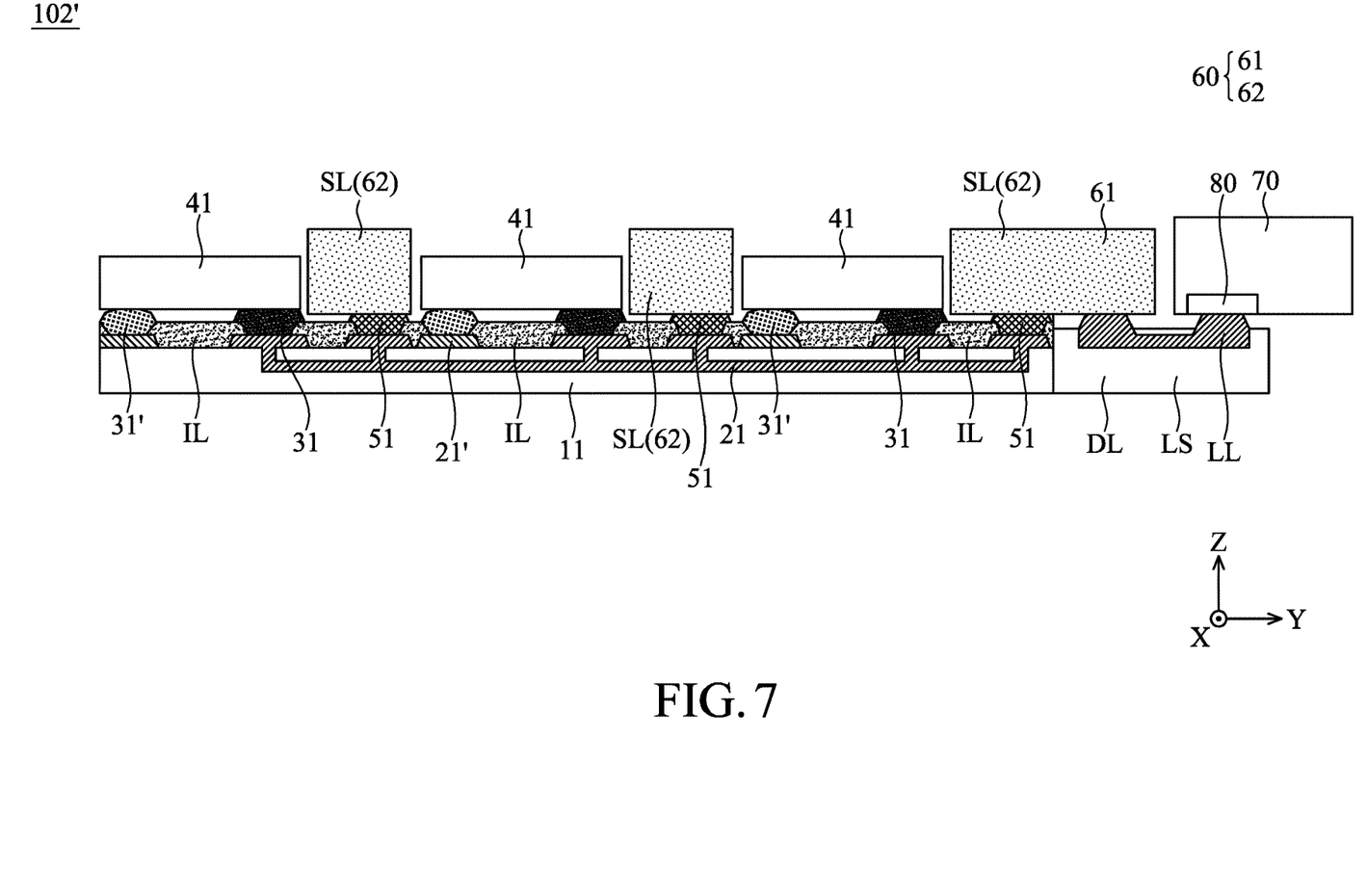
FIG. 7 is a partial cross-sectional view illustrating the electronic device along line C1-C1' in FIG. 6.

FIG. 6 is a partial top view illustrating an electronic device 102' according to another embodiment of the present disclosure. FIG. 7 is a partial cross-sectional view illustrating the electronic device 102' along line C1-C1' in FIG. 6. The embodiment as shown in FIG. 6 is similar to the embodiment as shown in FIG. 4. The differences between the embodiment as shown in FIG. 6 and the embodiment as shown in FIG. 4 is that the electronic device 102' may further include a circuit structure LS, and the circuit structure LS may be disposed corresponding to (or overlap) the first region 11-1 of the first substrate 11. In some embodiments, the circuit structure LS may be disposed under the first portion 61 of the conductive structure 60 as shown in FIG. 7, and the first portion 61 may be electrically connected to the conductive pad 80 of the circuit board 70 through the circuit structure LS, but it is not limited thereto. In some embodiments, the circuit structure LS may be disposed under the first portion 61 of the conductive structure 60, and the conductive structure 60 may be electrically connected to a voltage-signal supply circuit (not shown) through the circuit structure LS, but it is not limited thereto. In some embodiments, the circuit structure LS may include a composite-layer structure, which may include at least one dielectric layer DL and at least one circuit layer LL, the circuit layer LL may be electrically connected to the conductive pad 80 of the circuit board 70 as shown in FIG. 7, but it is not limited thereto.

Figure 8:
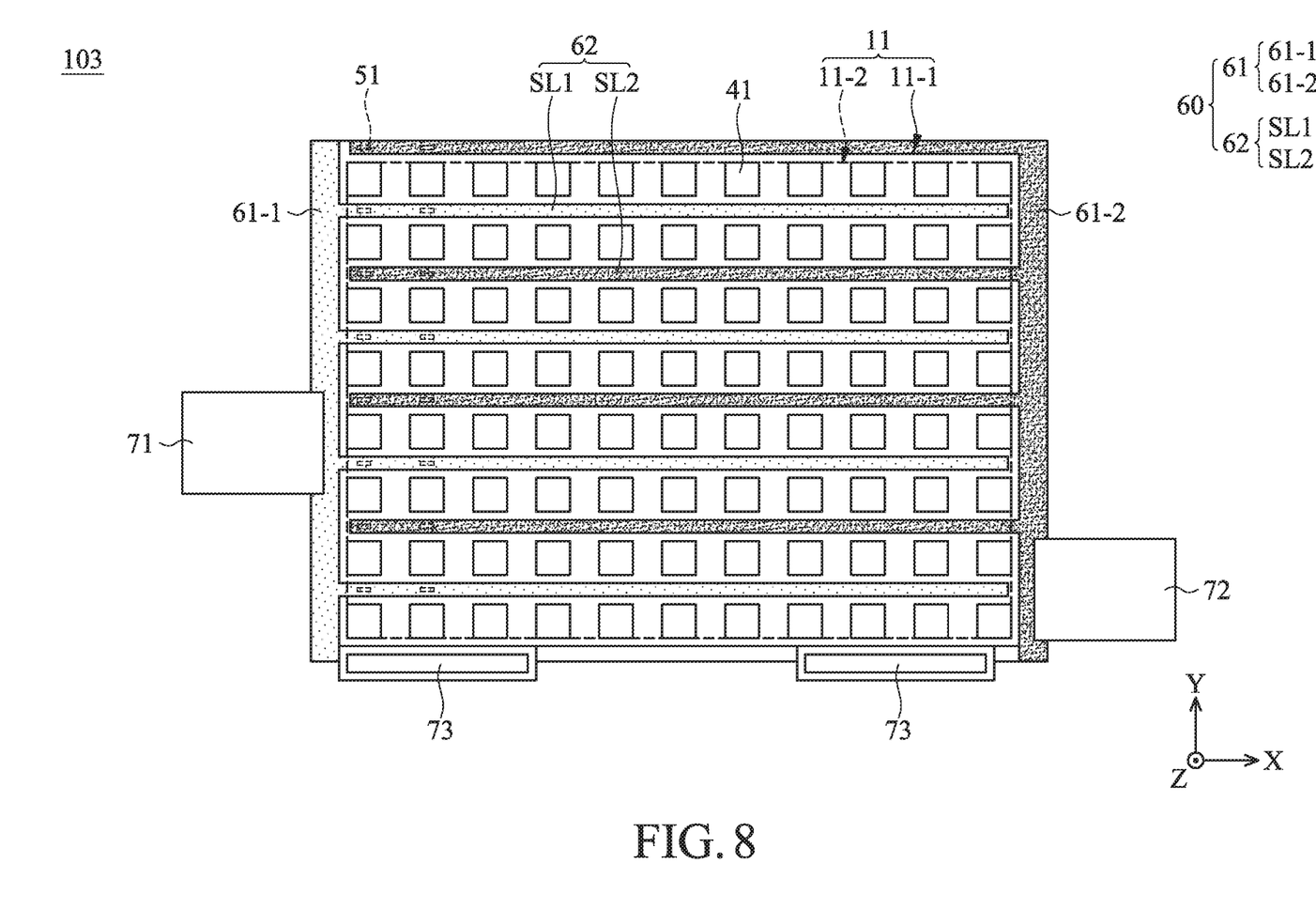
FIG. 8 is a partial top view illustrating an electronic device according to one embodiment of the present disclosure.

FIG. 8 is a partial top view illustrating an electronic device 103 according to one embodiment of the present disclosure. It should be noted that some elements may be omitted in FIG. 8 for the sake of brevity. The electronic device 103 as shown in FIG. 8 is similar to the electronic device 102 as shown in FIG. 4. One of the differences between these electronic devices is that the conductive structure 60 of the electronic device 103 may be interdigitated. For example, the conductive structure 60 may include a first portion 61 and a second portion 62. The first portion 61 may be divided into a section 61-1 and a section 61-2, and the second portion 62 may include at least one first signal line SL1 and at least one second signal line SL2, but it is not limited thereto.

In some embodiments, the first signal lines SL1 and the second signal lines SL2 may be extended along the X-direction as shown in FIG. 8, but it is not limited thereto. In some embodiments, the first signal lines SL1 and the second signal lines SL2 may be alternately disposed. That is, the first signal lines SL1 and the second signal lines SL2 may not overlap in the Z-direction, but it is not limited thereto. In some embodiments, the material of the first signal line SL1 may be the same as or different from the material of the second signal line SL2. In some embodiments, the first signal line SL1 may be connected to section 61-1 of the first portion 61, and the first signal line SL1 may be electrically connected to the circuit board 71 (or the voltage-signal supply circuit) through section 61-1, but it is not limited thereto. In some embodiments, the second signal line SL2 may be connected to section 61-2 of the first portion 61, and the second signal line SL2 may be electrically connected to the circuit board 72 (or the voltage-signal supply circuit) through section 61-2, but it is not limited thereto.

In some embodiments, the circuit board 71 and the circuit board 72 may be used for supplying or transmitting the same voltage signal or different voltage signals. For example, the circuit board 71 may be used for supplying or transmitting supply voltage (VDD), and the circuit board 72 may be used for supplying or transmitting supply voltage (VSS) or ground reference voltage, but it is not limited thereto. In some embodiment, the section 61-1 and the section 61-2 may be electrically insulated from each other.

In some embodiments, the electronic device 103 may further include at least one circuit board 73, and the circuit board 73 may be disposed on the first substrate. In more detail, the conductive pads (not shown) of the circuit board 73 may be electrically connected to conductive pads (not shown, and different from the conductive pads of the first signal pads and the first electrode pads) of the first substrate 11 the as shown in FIG. 8. The conductive pads of the circuit board 73 may be electrically connected to the conductive pads of the first substrate 11 directly, or the conductive pads of the circuit board 73 may be electrically connected to conductive pads of the first substrate 11 through an anisotropic conductive film (ACF).

Figure 9:
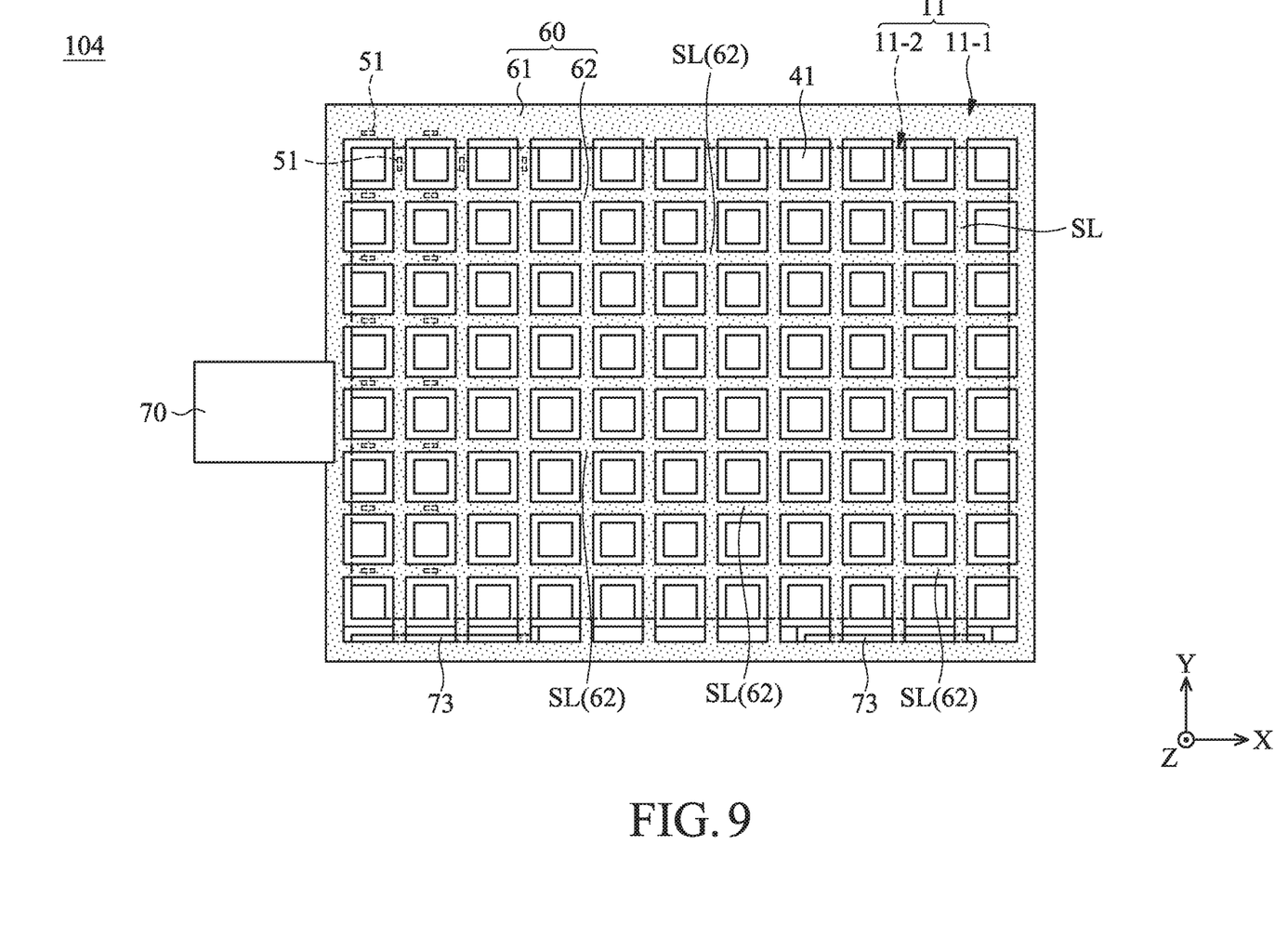
FIG. 9 is a partial top view illustrating an electronic device according to one embodiment of the present disclosure.

FIG. 9 is a partial top view illustrating an electronic device 104 according to one embodiment of the present disclosure. It should be noted that some elements may be omitted in FIG. 9, for the sake of brevity. The electronic device 104 as shown in FIG. 9 is similar to the electronic device 102 as shown in FIG. 4. One of the differences between these electronic devices is that the second portion 62 of the conductive structure 60 may include the signal lines SL extending along the X-direction, and signal lines SL extending along the Y-direction. That is, the signal lines SL of the second portion 62 may form a grid structure (or net structure), but it is not limited thereto. The light-emitting (or display) uniformity of the electronic device may be increased by the conductive structure 60. In some embodiments, the second portion 62 of the conductive structure 60 may include the signal lines SL extending along other directions. In some embodiments, the shape of the second portion 62 of the conductive structure 60 may have other irregular-shaped. In some embodiments, one of the first light-emitting units 41 may be connected and disposed corresponding to at least one of the first signal pads 51 as shown in FIG. 9. In some embodiments, the number of the first signals pad 51 and/or the positions of the first signals pad 51 connected and disposed corresponding to different first light-emitting units 41 may be the same or different.

Figure 10:
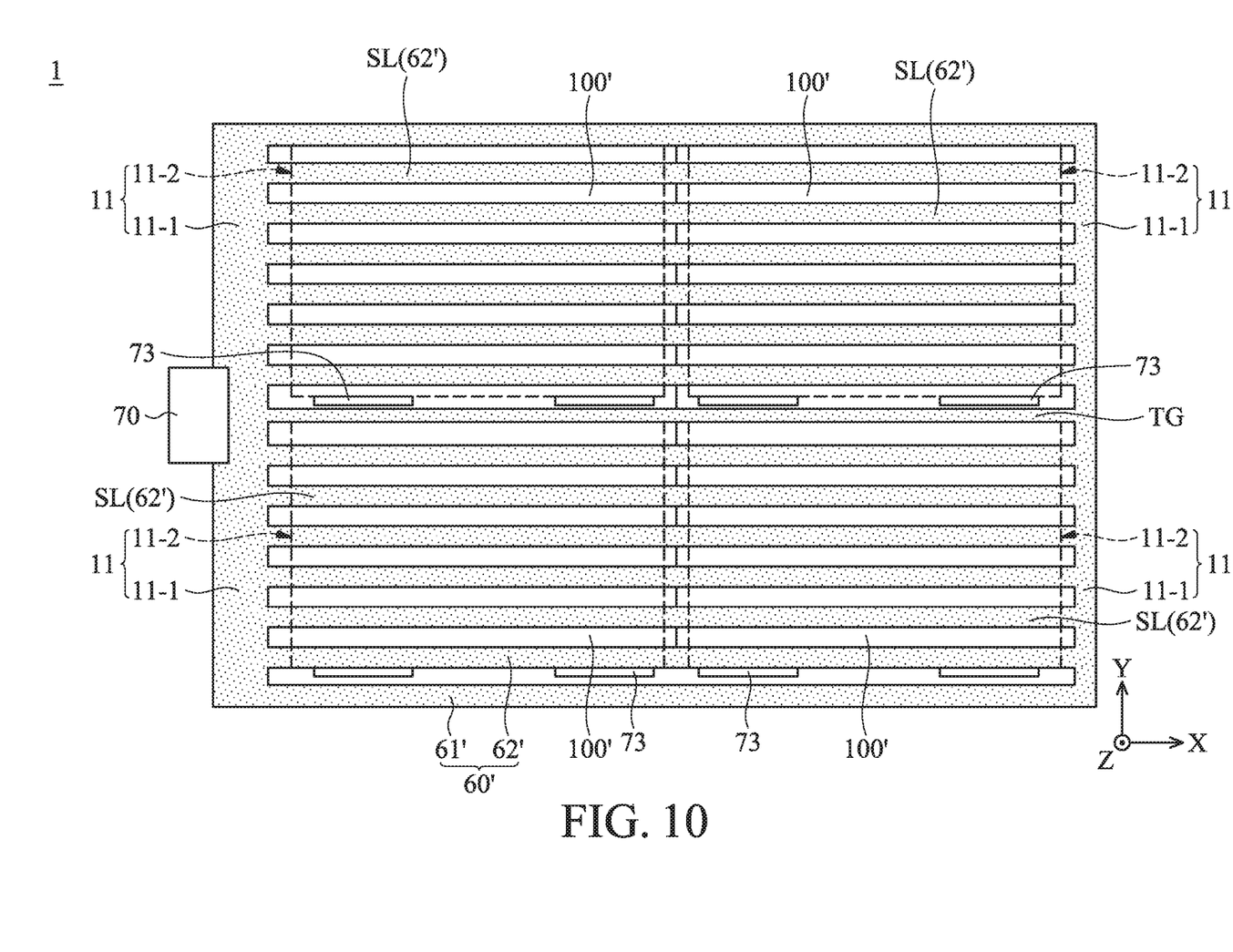
FIG. 10 is a partial top view illustrating a tiled electronic device according to one embodiment of the present disclosure.

FIG. 10 is a partial top view illustrating a tiled electronic device 1 according to one embodiment of the present disclosure. As shown in FIG. 1, the tiled electronic device 1 may include a plurality of electronic devices 100'. For example, the structure of the electronic devices 100' may be similar to the structure of the electronic devices 100 as shown in FIG. 1, the structure of the electronic devices 102 as shown in FIG. 2, the structure of the electronic devices 102' as shown in FIG. 6, the structure of the electronic devices 103 as shown in FIG. 8, or the structure of the electronic devices 104 as shown in FIG. 9, except for the conductive structure 60.

In some embodiments, the conductive structure 60' of the tiled electronic device 1 may be divided into a first portion 61' and a second portion 62', the first portion 61' may be disposed corresponding to (or overlap) the non-operating region (or non-display region), and the second portion 62' may be disposed corresponding to (or overlap) the operating region (or display region) as shown in FIG. 10. In some embodiments, the material of the first portion 61' of the conductive structure 60' may be the same as or similar to the material of the first portion 61 of the conductive structure 60, and the material of the second portion 62' of the conductive structure 60' may be the same as or similar to the material of the second portion 62 of the conductive structure 60. In this embodiment, the material of the first portion 61' of the conductive structure 60' may be the same as or different than the material of the second portion 62' of the conductive structure 60'.

In some embodiments, the first portion 61' of the conductive structure 60' may be disposed corresponding to (or overlap) a tiled seam TG between two substrates as shown in FIG. 10, and the first portion 61' may be electrically connected with at least one signal line SL and the circuit board 70. In more detail, the first portion 61' may be electrically connected to the circuit board 70 (e.g., the conductive pad 80 of the circuit board 70), and the first portion 61' may transit the voltage signal to the signal line SL (or voltage-signal supply circuit). The signal line SL may be disposed corresponding to (or overlap) and be electrically connected to the signal pads (e.g., the first signal pads 51 or second signal pads 52 mentioned above) in different substrates, and the voltage signal may be transmitted to the light-emitting units (e.g., the first light-emitting units 41 or second light-emitting units 42 mentioned above) in different substrates through the signal line SL of the second portion 62', but it is not limited thereto. Due to the conductive structure 60', the transmission efficiency of the voltage signal may be enhanced, or the number of the circuit boards 70 (or the number of the voltage-signal supply circuit) may be reduced.

In general tiled electronic device may need to separately set and electrically connect to individual circuit boards between different substrates, and the tiled seam may be lager because the circuit boards need to occupy some spaces of the substrates. The electronic device (or the tiled electronic device) of the embodiments according to the present disclosure may deal with the issues.

In some embodiments, a protective material (referring to protective layer CL), a shielding material, other suitable materials or a combination thereof may be disposed (or coated) on the conductive structure 60' (or the conductive structure 60). The shielding material may be used for shielding the tiled seam TG between the substrates, and the protective material may be used for reducing collisions or increasing the yield of the electronic devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. An electronic device, comprising:
   a first substrate;
   a first conductive layer disposed on the first substrate;
   a plurality of first electrode pads disposed on the first conductive layer;
   a plurality of first light-emitting units overlapping and disposed on the first electrode pads, wherein the plurality of first light-emitting units is electrically connected to the plurality of first electrode pad respectively;
   a plurality of first signal pads electrically connected to the first conductive layer, wherein the plurality of first electrode pads are disposed between the plurality of first signal pads in a cross-sectional view of the electronic device; and
   a conductive structure disposed on the plurality of first signal pads, wherein the conductive structure surrounds the first substrate in a top view of the electronic device;
   wherein at least two of the plurality of first signal pads are electrically connected to each other through the conductive structure.

2. The electronic device according to claim 1, wherein the first substrate has a first region and a second region adjacent to the first region, the plurality of first light-emitting units is disposed corresponding to the second region, and the conductive structure comprises a first portion disposed corresponding to the first region.

3. The electronic device according to claim 2, wherein the conductive structure further comprises a second portion disposed corresponding to the second region, and at least part of the plurality of first signal pads is disposed corresponding to the second region.

4. The electronic device according to claim 3, wherein the second portion comprises at least one signal line, and a width of the at least one signal line is less than or equal to a gap between two adjacent ones of the plurality of first light-emitting units.

5. The electronic device according to claim 4, wherein a ratio of the width of the at least one signal line to the gap between two adjacent ones of the plurality of first light-emitting units is between 0.05 and 0.95.

6. The electronic device according to claim 4, wherein a material of the at least one signal line comprises metals or alloys.

7. The electronic device according to claim 4, wherein the at least one signal line has a first thickness, the first conductive layer has a second thickness, and a ratio of the first thickness to the second thickness is between 10 and 300.

8. The electronic device according to claim 4, wherein the at least one signal line has a first thickness, one of the plurality of first signal pads has a third thickness, and a ratio of the first thickness to the third thickness is between 0.05 and 100.

9. The electronic device according to claim 3, wherein the second portion comprises a plurality of signal lines, and the plurality of signal lines is extended along a first direction.

10. The electronic device according to claim 3, wherein the second portion comprises a plurality of first signal lines and a plurality of second signal lines, and the plurality of first signal lines and the plurality of second signal lines are alternately disposed.

11. The electronic device according to claim 3, wherein the second portion comprises a plurality of first signal lines and a plurality of second signal lines, the plurality of first signal lines is electrically connected to a first circuit board, the plurality of second signal lines is electrically connected to a second circuit board.

12. The electronic device according to claim 3, wherein the second portion comprises a plurality of signal lines, and the plurality of signal lines form a grid structure.

13. The electronic device according to claim 2, further comprising:
a circuit structure disposed corresponding to the first region; and
at least one circuit board electrically connected to at least one of the plurality of first signal pads through the conductive structure.

14. The electronic device according to claim 13, wherein the circuit structure comprises at least one dielectric layer and at least one circuit layer.

15. The electronic device according to claim 1, wherein the conductive structure is used for transmitting a voltage signal.

16. The electronic device according to claim 15, wherein the voltage signal includes a supply voltage, a bias voltage, a reset voltage or a ground voltage.

17. The electronic device according to claim 1, further comprising:
a second substrate;
a second conductive layer disposed on the second substrate;
a plurality of second electrode pads disposed on the second conductive layer;
a plurality of second light-emitting units overlapping and disposed on the plurality of second electrode pads, and electrically connected to the plurality of second electrode pads respectively; and
a plurality of second signal pads disposed on the second conductive layer and electrically connected to the second conductive layer;
wherein at least one of the plurality of second signal pads is electrically connected to at least one of the plurality of first signal pads through the conductive structure.

18. The electronic device according to claim 17, further comprising:
at least one circuit board electrically connected to at least one of the plurality of second signal pads and electrically connected to at least one of the plurality of the first signal pads through the conductive structure.

19. The electronic device according to claim 17, wherein a tiled seam is formed between the first substrate and the second substrate, and at least one portion of the conductive structure is disposed corresponding to the tiled seam.

20. The electronic device according to claim 1, further comprising:
a protective layer disposed on the conductive structure.

* * * * *